US006332924B1

(12) United States Patent
Shim et al.

(10) Patent No.: US 6,332,924 B1
(45) Date of Patent: Dec. 25, 2001

(54) PHOTORESIST DISPENSING DEVICE

(75) Inventors: Kyoung Sup Shim; Jong Suk Kim, both of Kyonggi-do (KR)

(73) Assignee: Taeyang Tech Co., Ltd., Hwasung-gun (KR)

( * ) Notice: Subject to any disclaimer, the term of this patent is extended or adjusted under 35 U.S.C. 154(b) by 0 days.

(21) Appl. No.: 09/506,813

(22) Filed: Feb. 18, 2000

(30) Foreign Application Priority Data

Feb. 18, 1999 (KR) .................................................. 99-5403

(51) Int. Cl.⁷ ....................................................... B05C 5/02
(52) U.S. Cl. .............................. 118/684; 118/52; 118/56; 118/319; 118/320; 222/571; 239/119
(58) Field of Search ................................ 118/684, 52, 56, 118/319, 320; 222/571, 52, 71; 239/119, 106

(56) References Cited

U.S. PATENT DOCUMENTS

| | | | |
|---|---|---|---|
| 3,895,748 | * | 7/1975 | Klingenberg .......................... 222/571 |
| 5,134,962 | * | 8/1992 | Amada et al. ......................... 118/688 |
| 5,950,923 | * | 9/1999 | Fukano et al. ........................ 239/119 |
| 5,950,924 | * | 9/1999 | Hatakeyama et al. ................ 239/119 |
| 6,062,442 | * | 5/2000 | Yang et al. ............................. 118/319 |

* cited by examiner

Primary Examiner—Laura Edwards
(74) Attorney, Agent, or Firm—Staas & Halsey LLP

(57) ABSTRACT

A photoresist dispensing device for use in applying a metered amount of photoresist on a wafer comprises, a photoresist storage tank, a nozzle for spraying the photoresist on the wafer, a feeder unit for drawing a metered amount of the photoresist out of the storage tank and discharging it through the nozzle, a pneumatic control unit for controlling the operation of the feeder unit with the use of pressurized air; and a filter disposed in between the storage tank and the feeder unit for removing alien matters present the photoresist. The feeder unit includes a base having an inlet port leading to the storage tank, an outlet port leading to the nozzle and first through third intermediate passageways interconnecting the inlet and outlet ports, a first cutoff valve mounted on the base at a position between the inlet port and the first intermediate passageway, a diaphragm pump attached to the base at a position between the first and second intermediate passageways, a second cutoff valve secured to the base at a position between the second and third intermediate passageways, and a suck-back valve affixed to the base at a position between the third intermediate passageway and the outlet port.

7 Claims, 5 Drawing Sheets

PHOTORESIST DISPENSING DEVICE

FIELD OF THE INVENTION

The present invention is directed to a photoresist dispensing device adapted for use in applying a film of photoresist on a silicon wafer in the process of manufacturing semiconductor chips.

DESCRIPTION OF THE PRIOR ART

As is notoriously known in the art, semiconductor chips can be produced through a series of fabrication processes, including a lithography process wherein a photoresist film is applied on a silicon wafer. The photoresist film will then be exposed to a light or beam through a mask to thereby leave a circuit pattern which in turn goes through a selective chemical etching.

It is of paramount importance that the photoresist film be applied with a uniform thickness in the course of lithography process to assure enhanced yield rate of the simiconductor chips. Such a photoresist application process has been carried out by means of a photoresist dispensing device.

Schematically shown in FIG. 1 is a prior art photoresist dispensing device which makes use of pressurized air as a power source. The prior art photoresist dispensing device includes a storage tank 1 containing liquid photoresist and a bellows pump 2 connected to the storage tank 1 so that, when operated, it can suck up and forcedly transport the photoresist in the storage tank 1 via a supply line. At the downstream side of the bellows pump 2, there is disposed a filter 3 that serves to remove alien matters possibly existing in the stream of photoresist. A vent valve 3a is utilized to discharge air gathered in the filter 3 to the outside.

Provided at the downstream side of the filter 3 is a pneumatic regulator check valve 4 that functions to inhibit any backflow of the photoresist, while regulating the pressure of the photoresist flowing therethrough. The regulator check valve 4 is connected to a nozzle 6 by way of a suck-back valve 5. The nozzle 6 is adapted to spray the photoresist onto a silicon wafer 10 which remains firmly held by a rotating spin chuck 11. The suck-back valve 5 is operable to suck back the residual photoresist adhered to the tip end of the nozzle 6, thus avoiding any unwanted dropping of the residual photoresist on the silicon wafer. All of the bellows pump 2, the regulator check valve 4 and the suck-back valve 5 are pneumatically operated and associated with an air pressure source(not shown) through an air pressure line 8 and a solenoid valve 9.

In accordance with the prior art photoresist dispensing device referred to above, there is a tendency that foreign matters are accumulated in the filter 3 with the lapse of operating time, thus resulting in the filter 3 being clogged at least partially. Even though the bellows pump 2 operates under a normal condition, therefore, the pressure of the photoresist at the downstream side of the clogged filter 3 will be dropped sharply, which leads to substantial reduction in the amount of the photoresist to be fed to the regulator check valve 4. The means that it becomes no longer possible to supply a metered amount of photoresist to the nozzle 6 under a constant pressure, making the thickness of the photoresist film on the wafer irregular and uneven. Mainly because the silicon wafer 10 is caused to rotate by means of the spin chuck 11, the photoresist film formed on the wafer 10 would suffer what is called "speed boat" in the event that the amount and pressure of the photoresist sprayed is not kept constant.

It might be of course possible for the operator to periodically check the degree of contamination of the filter 3 and replace any heavily contaminated filter with a new one as frequently as possible. This would however result in a decreased manufacturability because the fabrication system has to be stopped each time the filter replacing operation is carried out. As an alternative, it can be taken into account that the amount of the photoresist to be supplied is increased enough to prevent the pressure drop, in which case, the cost of fabricating the semiconductor chips becomes higher due largely to the large-scale use of expensive photoresist.

SUMMARY OF THE INVENTION

Accordingly, it is an object of the invention to provide a photoresist dispensing device which can apply photoresist on a silicon wafer in a metered amount and under a controlled pressure to thereby form a uniform thickness of photoresist film on the wafer.

Another object of the invention is to provide a photoresist dispensing device which has a feeder unit of easy-to-repair, compact structure and operable in such a manner as to accurately control the amount and pressure of the photoresist to be dispensed.

With these objects in view, the instant invention provides a photoresist dispensing device for use in applying a metered amount of photoresist on a wafer comprising, a photoresist storage tank, a nozzle for spraying the photoresist on the wafer, a feeder unit for drawing a metered amount of the photoresist out of the storage tank and discharging the photoresist through the nozzle, a pneumatic control unit for controlling the operation of the feeder unit with the use of pressurized air, and a filter disposed between the storage tank and the feeder unit for removing alien matters present in the photoresist. The feeder unit includes a base having an inlet port leading to the storage tank, an outlet port leading to the nozzle and first through third intermediate passageways interconnecting the inlet and outlet ports, a first cutoff valve mounted on the base at a position between the inlet port and the first intermediate passageway, a diaphragm pump attached to the base at a position between the first and second intermediate passageways, a second cutoff valve secured to the base at a position between the second and third intermediate passageways, and a suck-back valve affixed to the base at a position between the third intermediate passageway and the outlet port.

BRIEF DESCRIPTION OF THE DRAWINGS

The above and other objects, features, advantages of the invention will become apparent from a review of the following detailed description of the preferred embodiment taken in conjunction with the accompanying drawings, in which.

DETAILED DESCRIPTION OF THE PREFERRED EMBODIMENT

Figure 1:
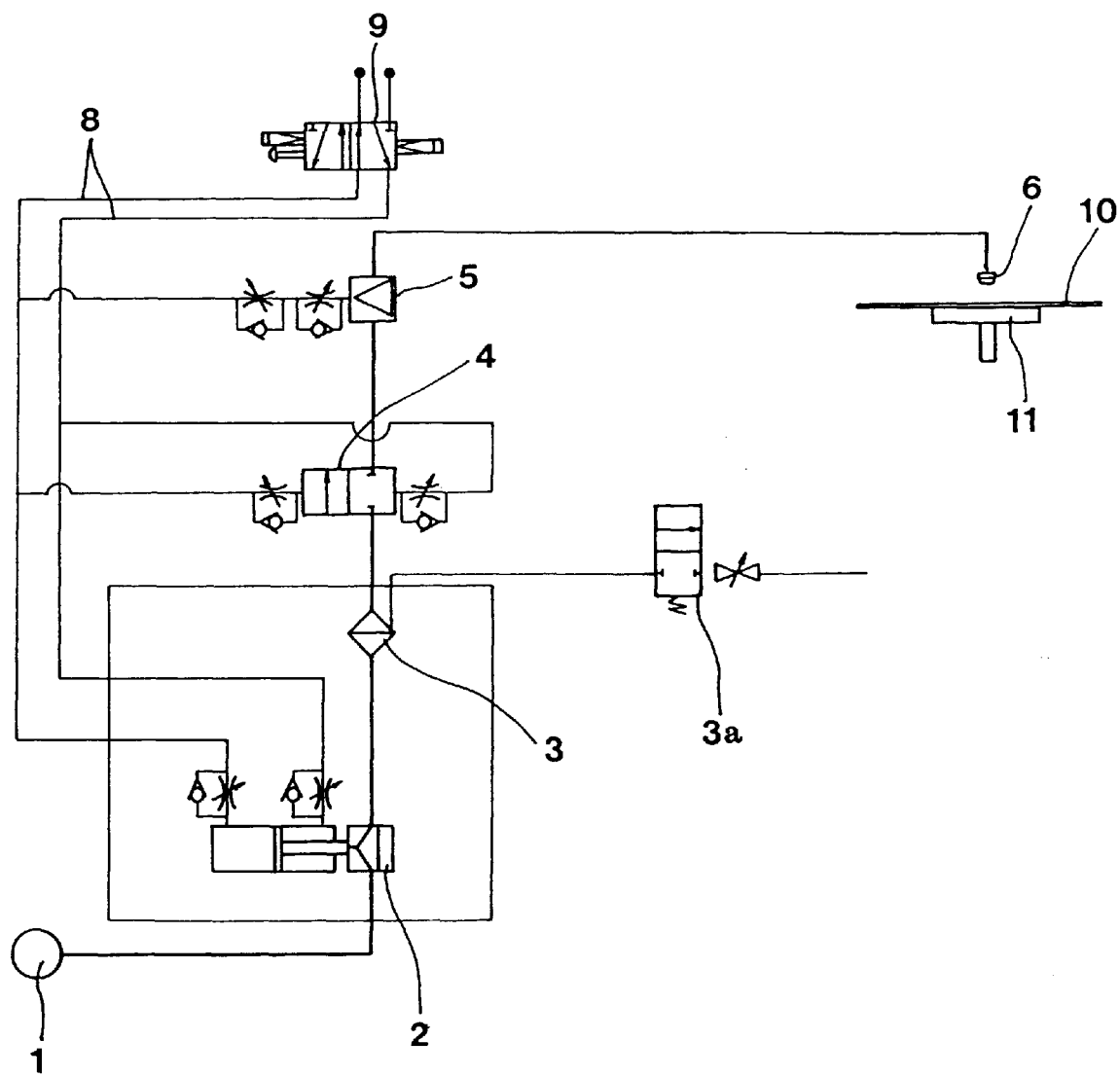
FIG. 1 is a schematic circuit diagram illustrating an example of the prior art photoresist dispensing devices.
Figure 2:
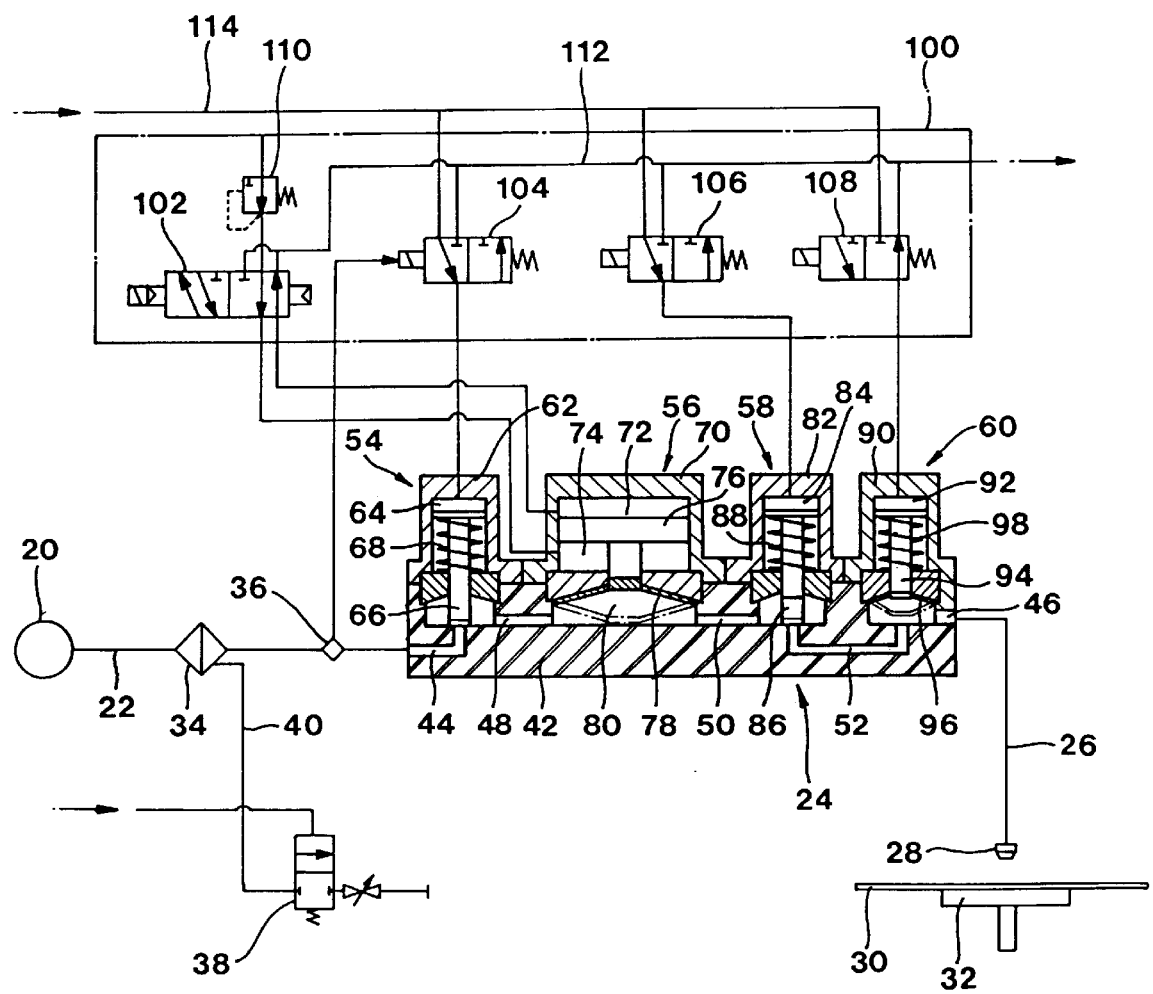
FIG. 2 is a circuit diagram showing a photoresist dispensing device in accordance with the invention, with a feeder unit depicted in cross-section for better understanding of its operation.
Figure 3:
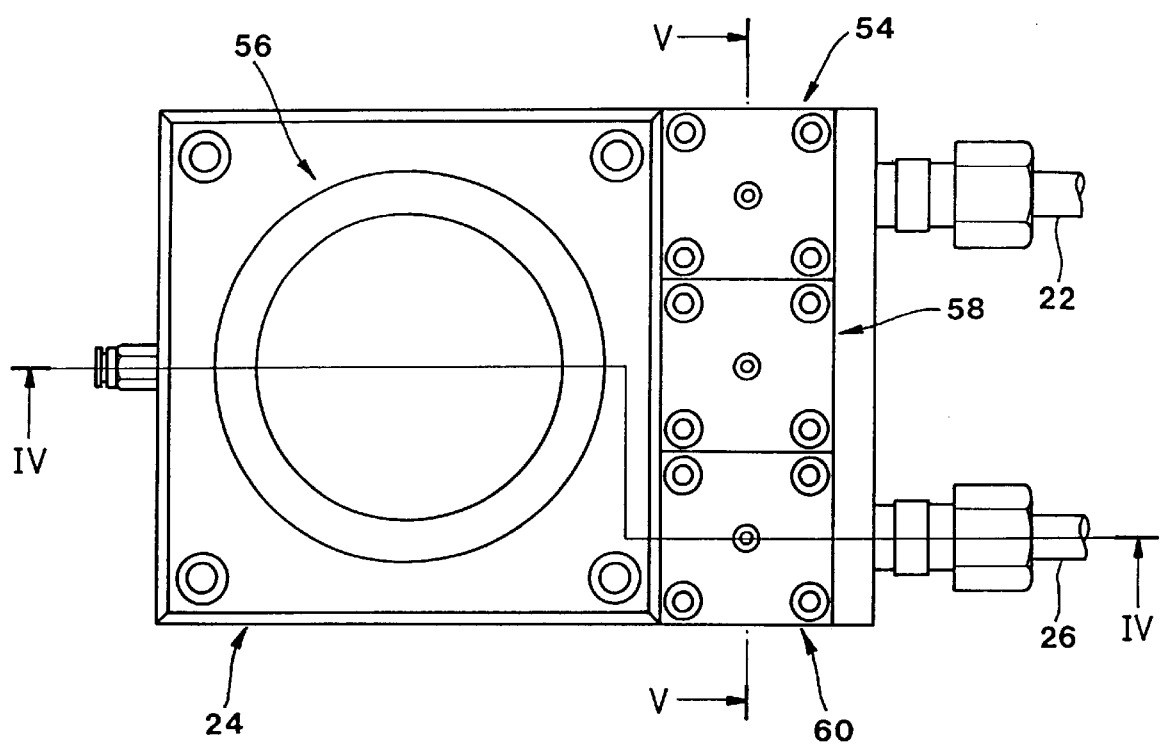
FIG. 3 is a top view of the feeder unit incorporated in the photoresist dispensing device according to the invention.

Referring first to FIG. 2, it can be appreciated that a photoresist dispensing device according to the invention is adapted to use pressurized air as a power source and is provided with a storage tank 20 for holding the photoresist to be dispensed. The storage tank 20 remains in fluid communication with a feeder unit 24 via a supply line 22. The feeder unit 24 leads to a spray nozzle 28 by way of an exhaust line 26, with the nozzle 28 being oriented such that it can apply the photoresist on the surface of a silicon wafer 30 which is firmly held by a rotating spin chuck 32.

Provided between the storage tank 20 and the feeder unit 24 is a filter 34 that serves to remove alien matters such as particulates and air bubbles possibly present in the photoresist flowing through the supply line 22. Complete removal of alien matters from the photoresist is very important to assure production of semiconductor chips with an increased yield rate. At the downstream side of the filter 34, there is provided an air detector 36 that can generate an inlet port cutoff signal whenever the storage tank 20 runs dry and, instead of photoresist, air is supplied from the tank 20. Connected to the filter 34 via a vent line 40 is a vent valve 38 which is normally kept in a closed position and may be shifted under the action of pneumatic pressure into an open position wherein the air gathered in the filter 34 is allowed to be discharged to the outside.

With reference to FIGS. 2 through 5, it can be seen that the feeder unit 24 is provided with a base 42 having an inlet port 44 leading to the storage tank 20 through the supply line 22, an outlet port 46 leading to the nozzle 28 through the exhaust line 26, and first through third intermediate passageways 48, 50, 52 interconnecting the inlet port 44 and the outlet port 46.

The feeder unit 24 is further provided with a first cutoff valve 54 mounted on the base 42 at a position between the inlet port 44 and the first intermediate passageway 48, a diaphragm pump 56 attached to the base 42 at a position between the first and second intermediate passageways 48, 50, a second cutoff valve 58 secured to the base 42 at a position between the second and third intermediate passageways 50, 52, and a suck-back valve 60 affixed to the base 42 at a position between the third intermediate passageway 52 and the outlet port 46.

It will be noted that the first cutoff valve 54 includes a valve housing 62 with an air pressure chamber 64, a valve stem 66 extendibly fitted into the valve housing 62 for movement between an extended position at which the valve stem 66 closes up the inlet port 44 of the base 42 and a retracted position at which the valve stem 66 gets the inlet port 44 open, and a compression spring 68 for normally biasing the valve stem 66 into the retracted position to open the inlet port 44. The first cutoff valve 54 is operable in such a manner that introduction of the pressurized air into the air pressure chamber 64 of the valve housing 62 causes the valve stem 66 to be moved into the extended position against the resilient force of the compression spring 68, thus closing up the inlet port 44 of the base 42.

Figure 4:
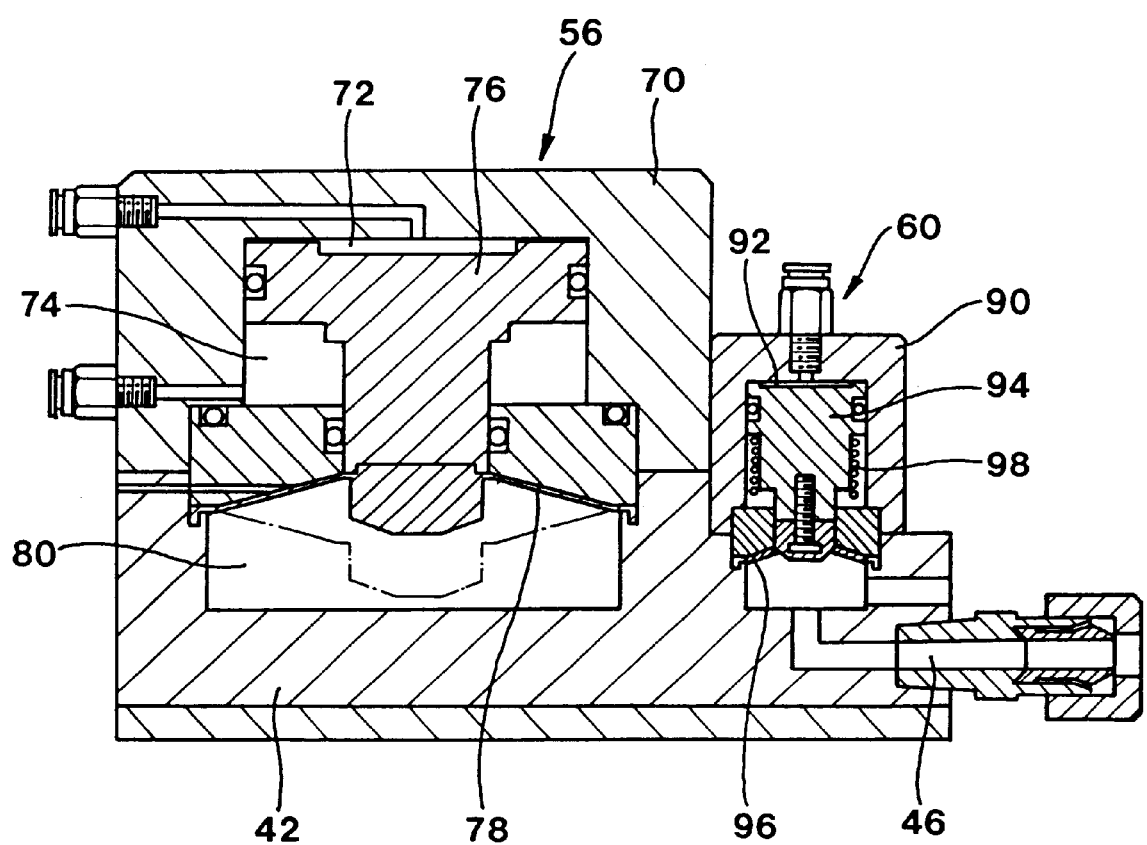
FIG. 4 is a sectional view taken along line IV—IV in FIG. 3, best showing a base, a diaphragm pump and a suck-back valve of the feeder unit.
Figure 5:
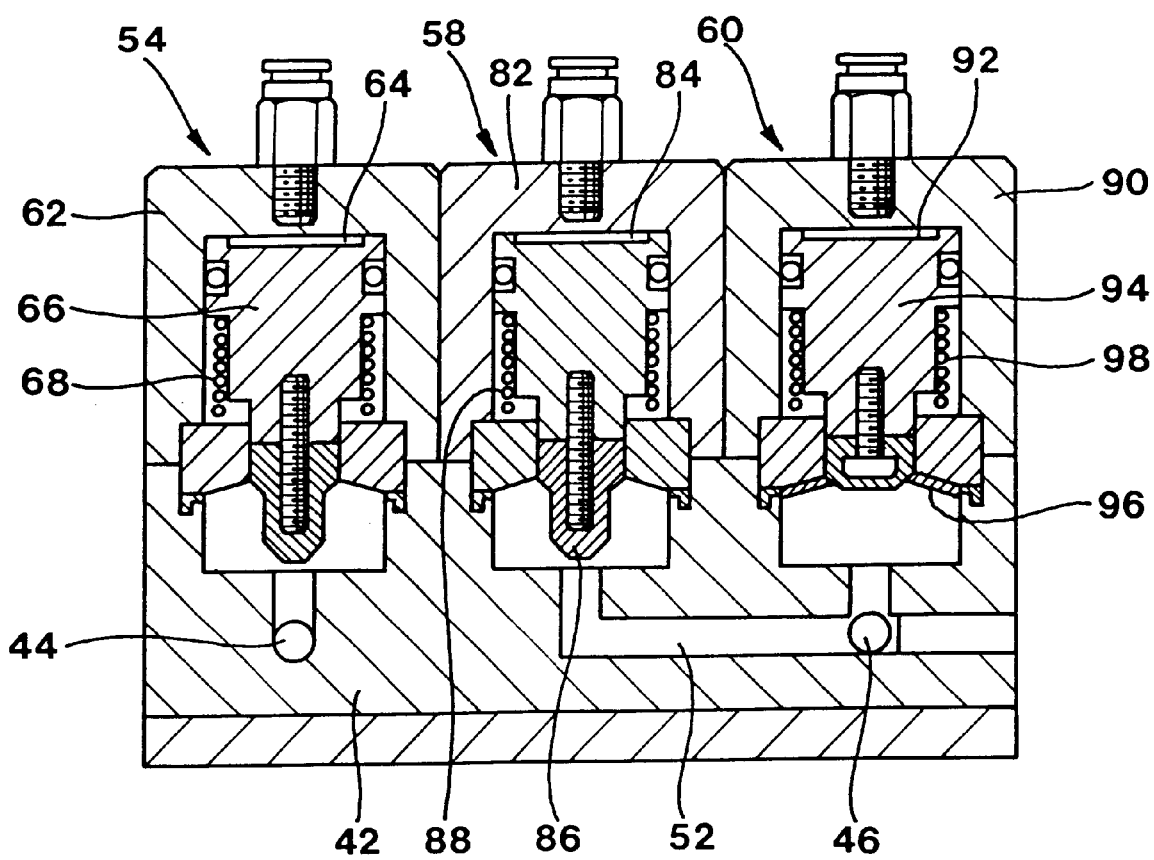
FIG. 5 is a sectional view taken along line V—V in FIG. 3, best illustrating a base, a first cutoff valve, a second cutoff valve and suck-back valve.

As clearly shown in FIGS. 2 and 4, the diaphragm pump 56 includes a pump housing 70 with first and second air pressure chambers 72, 74, a piston 76 extendibly fitted into the pump housing 70 for movement between an extended position and a retracted position, and a diaphragm 78 secured to the piston 76 at its center and to the base 42 at its peripheral edge. If the pressurized air is admitted into the first chamber 72 of the pump housing 70, the piston 70 will be caused to move into the extended position whereby the diaphragm 78 is flexed downwardly to forcedly discharge the photoresist filled in a pumping cavity 80 toward the nozzle 28. On the contrary, introduction of the pressurized air into the second chamber 74 allows the piston 76 to be returned back to the retracted position whereby the diaphragm 78 is flexed upwardly to suck the photoresist held in the storage tank 20 into the pumping cavity 80 through the inlet port 44.

As with the first cutoff valve 54 set forth above, the second cutoff valve 58 includes a valve housing 82 with an air pressure chamber 84, a valve stem 86 extendibly fitted into the valve housing 82 for movement between an extended position at which the valve stem 86 closes up the third intermediate passageway 52 of the base 42 and a retracted position at which the valve stem 86 gets the third intermediate passageway 52 open, and a compression spring 88 for normally biasing the valve stem 86 into the retracted position to open the third intermediate passageway 52. In the event that the pressurized air is admitted into the air pressure chamber 84 of the valve housing 82, the valve stem 86 moves toward the extended position against the resilient force of the compression spring 88 to thereby close up the third intermediate passageway 52.

In the meantime, the suck-back valve 60 includes a valve housing 90 with an air pressure chamber 92, a valve stem 94 extendibly fitted into the valve housing 90 for movement between an extended position and a retracted position, a diaphragm 96 affixed to the valve stem 94 at its center and to the base 42 of the feeder unit 24 at its peripheral edge, and a compression spring 98 for normally urging the valve stem 94 into the retracted position. As the pressurized air is introduced into the air pressure chamber 92 of the valve housing 90, the valve stem 94 moves toward the extended position against the resilient force of the compression spring 98 to have the diaphragm 96 flexed downwardly. If, conversely, the pressurized air is released from the air pressure chamber 92, the valve stem 94 will be returned back to the retracted position under the action of the compression spring 98, causing the diaphragm 96 to be flexed upwards so that vacuum can be produced at the tip end of the nozzle 28.

It should be noted that operation of the feeder unit 24 described hereinabove is controlled by means of a pneumatic control unit 100 which, as illustrated only in FIG. 2, comprises first through fourth electromagnetic control valves 102, 104, 106, 108 and a pressure regulator valve 110.

The first control valve 102 is shiftable between a piston retracting position wherein the first chamber 72 of the diaphragm pump 56 communicates with an air drain line 112 while the second chamber 74 thereof is in communication with an air supply line 114 to cause the piston 76 of the diaphragm pump 56 to be retracted and a piston extending position wherein the first chamber 72 of the diaphragm pump 56 communicates with the air supply line 114 while the second chamber 74 thereof is connected to the air drain line 112 to have the piston 76 of the diaphragm pump 56 extended. The pressure of the air fed to the diaphragm pump 56 through the air supply line 114 is kept constant by the pressure regulator valve 110.

The second control valve 104 is shiftable between an air intake position and an air exhaust position and is normally kept in the air intake position. At the time the second control valve 104 remains in the air intake position, the pressure chamber 64 of the first cutoff valve 54 makes communication with the air supply line 114 such that the valve stem 66 can be extended by the pressurized air. If, however, the second control valve 104 is shifted into the air exhaust position, the pressure chamber 64 of the first cutoff valve 54 will be allowed to communicate with the air drain line 112, enabling the valve stem 66 to be retacted by the resilient force of the compression spring 68.

The third control valve 106 is shiftable between an air intake position and an air exhaust position and is normally maintained in the air intake position. In case the third control valve 106 assumes the air intake position, the air pressure chamber 84 of the second cutoff valve 58 is connected to the air supply line 114 so that the valve stem 86 can be extended by the pressurized air. If the third control valve 106 is shifted into the air exhaust position, the pressure chamber 84 of the second cutoff valve 58 leads to the air drain line 112 to ensure that the valve stem 86 can be retracted by the compression spring 88.

Likewise, the fourth control valve 108 is shiftable between an air intake position and an air exhaust position but is normally maintained in the air exhaust position wherein the air pressure chamber 92 of the suck-back valve 60 communicates with the air drain line 112 such that the valve stem 94 can be retracted by the compression spring 98. If the fourth control valve 108 is shifted into the air intake position, the pressure chamber 92 of the suck-back valve 60 is connected to the air supply line 114 so that the valve stem 94 can be extended by the action of the pressurized air.

Operation of the photoresist dispensing device according to the invention will now be described with particular reference to FIG. 2.

In order to have the photoresist in the storage tank 20 forcedly transported to the nozzle 28, it becomes necessary to shift the second control valve 104 of the pneumatic control unit 100 into the air exhaust position while maintaining the third control valve 106 in the air intake position. This allows the valve stem 66 of the first cutoff valve 54 to be retracted by the resilient force of the compression spring 68, thus opening the inlet port 44 of the base 42. At the same moment, the valve stem 86 of the second cutoff valve 58 is extended under the action of the pressurized air to thereby close up the third intermediate passageway 52 of the base 42.

The first control valve 102 is then shifted into the piston extending position to have the piston 76 of the diaphragm pump 56 extended, whereby the diaphragm 78 is flexed downwardly, as indicated in phantom lines in FIG. 2, to minimize the volume of the pumping cavity 80. And the fourth control valve 108 is shifted into the air intake position to feed the pressurized air to the suck-back valve 60. This causes the valve stem 94 of the suck-back valve 60 to be extended, thus assuring that the diaphragm 96 be flexed downwards as shown in phantom lines in FIG. 2.

Under the ready condition noted just above, the first control valve 102 of the pneumatic control unit 100 is brought into the piston retracting position, causing the piston 76 of the diaphragm pump 56 to assume the retracted position such that the diaphragm 78 can be flexed upwardly to maximize the volume of the pumping cavity 80, as illustrated in solid lines in FIG. 2. Accordingly, the photoresist in the storage tank 20 is sucked into the pumping cavity 80 via the supply line 22, the inlet port 44 and the first intermediate passageway 48.

In the course of drawing the photoresist out of the storage tank 20, the filter 34 serves to remove and gather alien matters, such as particulates and air bubbles, present in the photoresist. The air bubbles collected in the filter 34 are discharged to the outside each time the vent valve 38 is activated to open to vent line 40. If the photoresist in the storage tank 20 runs dry and air is supplied from the tank 20, the air detector 36 will generate an air detection signal and enable the second control valve 104 to be shifted into the air intake position so that the first cutoff valve 54 can close up the inlet port 44 of the base 42.

Once a metered amount of the photoresist is drawn from the storage tank 20 into the pumping cavity 80 of the diaphragm pump 56 in this manner, the second control valve 104 of the pneumatic control unit 100 will then be shifted into the air intake position such that the first cutoff valve 54 can close up the inlet port 44. Concurrently, the third control valve 106 is shifted into the air exhaust position to thereby enable the second cutoff valve 58 to open the third intermediate passageway 50.

The next step is to shift the first control valve 102 into the piston extending position, in response to which the pressurized air is introduced into the first pressure chamber 72 of the diaphragm pump 56 to cause extending movement of the piston 76. This ensures that the diaphragm 78 be flexed downwardly to reduce the volume of the pumping cavity 80, as indicated in phantom lines in FIG. 2. As a result, the photoresist filled in the pumping cavity 80 is sent to the nozzle 28 via the second intermediate passageway 50, the third intermediate passageway 52, the outlet port 46 and the exhaust line 26, so that the nozzle 28 can apply a uniform thickness of photoresist film on the wafer 30.

Just after the photoresist is sprayed through the nozzle 28 onto the wafer 30, the fourth control valve 108 is shifted into the air exhaust position whereby the valve stem 94 of the suck-back valve 60 is retracted by the resilient force of the compression spring 98, thus causing the diaphragm 96 of the suck-back valve 60 to be flexed upwardly. This produces vacuum at the tip end of the nozzle 28 such that residual photoresist can be sucked back into the nozzle 28 without being inadvertently dropped on the wafer 30.

While the invention has been described with reference to a preferred embodiment, it should be apparent to those skilled in the art that many changes and modifications may be made without departing from the scope of the invention as defined in the claims.

What is claimed is:

1. A photoresist dispensing device for use in applying a metered amount of photoresist on a wafer, comprising:
   a photoresist storage tank;
   a nozzle for spraying the photoresist on the wafer;
   a feeder unit for drawing a metered amount of the photoresist out of the storage tank and discharging the photoresist through the nozzle;
   a pneumatic control unit for controlling the operation of the feeder unit with the use of pressurized air; and
   a filter disposed between the storage tank and the feeder unit for removing alien matters present in the photoresist, wherein the feeder unit includes: a base having an inlet port leading to the storage tank, an outlet port leading to the nozzle and first through third intermediate passageways interconnecting the inlet and outlet ports; a first cutoff valve mounted on the base at a position between the inlet port and the first intermediate passageway; a pump attached to the base at a position between the first and second intermediate passageways; a second cutoff valve secured to the base at a position between the second and third intermediate passageways; and a suck-back valve affixed to the base at a position between the third intermediate passageway and the outlet port.

2. The photoresist dispensing device as recited in claim 1, further comprising a vent valve connected to the filter via a vent line and operable to release air gathered in the filter to the outside.

3. The photoresist dispensing device as recited in claim 1, further comprising an air detector disposed between the filter and the feeder unit for causing the first cutoff valve to close up the inlet port of the base of the feeder unit when air is supplied from the storage tank.

4. The photoresist dispensing device as recited in claim 1, wherein the pump includes a pump housing with first and second air pressure chamber, a piston extendibly fitted into the pump housing, and a diaphragm fixedly secured to the piston at it center and to the base of the feeder unit at its peripheral edge.

5. The photoresist dispensing device as recited in claim 4, wherein the first cutoff valve includes a valve housing with an air pressure chamber, a valve stem extendibly fitted into the valve housing of the first cutoff valve for movement between an extended position at which the valve stem closes up the inlet port of the base and a retracted position at which the valve stem gets the inlet port open, and a compression spring for normally biasing the valve stem into the retracted position to open the inlet port.

6. The photoresist dispensing device as recited in claim 5, wherein the second cutoff valve includes a valve housing with an air pressure chamber, a valve stem extendibly fitted into the valve housing of the second cutoff valve for movement between an extended position at which the valve stem of the second cutoff valve closes up the third intermediate passageway and a retracted position at which the valve stem of the second cutoff valve gets the third intermediate passageway open, and a compression spring for normally biasing the valve stem of the second cutoff valve into the retracted position to open the third intermediate passageway.

7. The photoresist dispensing device as recited in claim 6, wherein the suck-back valve includes a valve housing with an air pressure chamber, a valve stem extendibly fitted into the valve housing of the suck-back valve, and a diaphragm affixed to the valve stem at its center and to the base of the feeder unit at its peripheral edge.

\* \* \* \* \*